United States Patent [19]

Takagi

[11] Patent Number: 4,748,491
[45] Date of Patent: May 31, 1988

[54] REDUNDANT CIRCUIT OF SEMICONDUCTOR DEVICE AND METHOD OF PRODUCING SAME

[75] Inventor: Hiroshi Takagi, Hyogo, Japan

[73] Assignee: Mitsubishi Denki Kabushiki Kaisha, Tokyo, Japan

[21] Appl. No.: 916,632

[22] Filed: Oct. 8, 1986

[30] Foreign Application Priority Data

Oct. 9, 1985 [JP] Japan .................. 60-226518

[51] Int. Cl.$^4$ ............................ H01L 27/02
[52] U.S. Cl. ........................ 357/51; 357/59
[58] Field of Search ....................... 357/51, 59

[56] References Cited

U.S. PATENT DOCUMENTS

| | | | |
|---|---|---|---|
| 4,135,295 | 1/1979 | Price | 357/51 |
| 4,518,981 | 5/1985 | Schlupp | 357/51 |
| 4,602,420 | 7/1986 | Saito | 357/51 |
| 4,617,723 | 10/1986 | Mukai | 357/51 |
| 4,628,590 | 12/1986 | Udo et al. | 375/51 |

FOREIGN PATENT DOCUMENTS 0148198 8/1984 Japan .................. 357/51

OTHER PUBLICATIONS

"Laser Programmable Redundancy and Yield Improvement in a 64K DRAM", Robert T. Smith et al, IEEE Journal of Solid-State Circuits, vol. SC-16, No. 5, Oct. 1981, pp. 506-513.

Primary Examiner—Martin H. Edlow
Assistant Examiner—D. Featherstone
Attorney, Agent, or Firm—Lowe, Price, LeBlanc, Becker & Shur

[57] ABSTRACT

A redundant circuit of a semiconductor device comprises a fuse (73) for laser trimming to connect between aluminum interconnections (6). The fuse (73) has a two-layer structure comprising a first film (3a) of polysilicon and a second film (7a) formed on the film (3a) of metal silicide, the line width $l_0$ of the first film (3a) being shorter than the line width $l_1$ of the second layer (7a). In addition, a PSG film (4) is formed to cover the fuse (73), and the laser beam is irradiated on the PSG film (4) in disconnecting the fuse (73). Accordingly, the first film (3a) having a short line width is uniformly fused and expanded, the fuse (73) is uniformly disconnected, and an opening (10) formed after explosion and splash thereof becomes smaller.

5 Claims, 5 Drawing Sheets

REDUNDANT CIRCUIT OF SEMICONDUCTOR DEVICE AND METHOD OF PRODUCING SAME

BACKGROUND OF THE INVENTION

1. Field of the Invention

The present invention relates to a redundant circuit of a semiconductor device and a method of producing the same, and more particularly relates to a redundant circuit of a semiconductor device including a fuse for laser trimming for replacing a circuit, and a method of producing the same.

2. Description of the Prior Art

A conventional redundant circuit of a semiconductor device utilizing a laser trimming system is described in, for example, an article by Robert T. Smith et al., entitled "Laser Programmable Redundancy and Yield Improvement in a 64K DRAM," IEEE Journal of Solid-State Circuits, Vol. SC-16, No. 5, Oct. 1981.

FIG. 1A is a plan view showing an example of a conventional redundant circuit of a semiconductor device, FIG. 1B is a cross sectional view taken along a line B—B in FIG. 1A, and FIG. 1C is a cross sectional view taken along a line C—C in FIG. 1A.

Referring now to FIGS. 1A to 1C, a method of producing the conventional redundant circuit of a semiconductor device is described. First, a field oxide film 2 is formed on a silicon substrate 1, and a fuse 3b of polysilicon is formed on the field oxide film 2. Then, a PSG (Phospho Silicate Glass) film 4 is deposited on the field oxide film 2 and the fuse 3b by a CVD (Chemical Vapour Deposition) process. Subsequently, the PSG film 4 is selectively etched away utilizing a photoresist film (not shown), so that a part of the fuse 3b is exposed to form a contact hole 5. An aluminum interconnection 6 is then formed on the PSG film 4 and through and over the contact hole 5 so as to be connected to the fuse 3b, whereby the redundant circuit of a semiconductor device is completed.

FIG. 2 is a cross sectional view in which the fuse 3b of the redundant circuit shown in FIGS. 1A to 1C is disconnected. A circuit in a semiconductor device is ordinarily replaced by disconnecting a fuse included in a redundant circuit by irradiation of the laser beam. In FIG. 1C, laser beam energy irradiated on the PSG film 4 is absorbed in the fuse 3b. Consequently, the fuse 3b is fused and expanded, so that it is exploded and splashed with the PSG film 4 and disconnected as shown in FIG. 2. As a result of explosion and splash thereof, an opening 9 is formed in the PSG film 4 as shown in FIG. 2, the base width of which is identical to the line width $l_1$ of the fuse 3b.

When the redundant circuit as shown in FIGS. 1A to 1C is used, the line width $l_1$ of the fuse 3b must be kept large to some extent to reliably irradiate the laser beam. However, when the line width $l_1$ of the fuse 3b is large, the opening 9 formed after explosion thereof also becomes large, so that high integration of a semiconductor device becomes difficult. In addition, when the line width $l_1$ is large, the temperature difference under heat becomes large between the central portion and the end of the fuse 3b so that it becomes difficult to reliably disconnect the fuse 3b.

SUMMARY OF THE INVENTION

Briefly stated, the present invention is directed to a redundant circuit of a semiconductor device including a first metal interconnection layer, a second metal interconnection layer formed apart from the first metal interconnection layer, a fuse for electrically connecting the first and second metal interconnection layers, and a glass film formed to cover the fuse, the fuse having a two-layer structure comprising a first linear film of a first material and a second linear film formed on the first film of a second material different from the first material, and the line width of the first film being narrower than that of the second film.

In accordance with another aspect of the present invention, a method of producing the redundant circuit of a semiconductor device comprises the steps of preparing a semiconductor substrate, forming a field oxide film on the semiconductor substrate, forming a first layer of a first material on the field oxide film, forming a second layer of a second material different from the first material on the first layer, etching the first and second layers to form a fuse having a two-layer structure comprising a first linear film of the first material and a second linear film of the second material having a wider line width than that of the first film, forming a glass film to cover the fuse, forming a contact hole in a predetermined position of the glass film, and forming first and second metal interconnection layers to be connected to the fuse through the contact hole.

Accordingly, a principal object of the present invention is to provide the redundant circuit of a semiconductor device capable of high integration and a method of producing the same.

Another object of the present invention is to provide a redundant circuit of a semiconductor device having an improved rate of success in replacing a circuit by the redundant circuit and a method of producing the same.

A principal advantage is that an opening formed after exploding and splashing the fuse can be decreased, since the first film of the melted and expanded fuse has a narrow line width.

Another advantage of the present invention is that the fuse can be uniformly and reliably disconnected by the laser beam, since the temperature distribution under heat becomes uniform in the first film of the fuse.

Still another advantage is that the line width of the fuse itself is not required to be reduced.

These objects and other objects, features, aspects and advantage of the present invention will become more apparent from the following detailed description of the present invention when taken in conjunction with the accompanying drawings.

DESCRIPTION OF THE PREFERRED EMBODIMENTS

FIGS. 3A to 3D are cross sectional views showing major processes producing the redundant circuit of a semiconductor device of an embodiment of the present invention.

Referring now to FIGS. 3A to 3D description is made on a method of producing redundant circuit of a semiconductor device of an embodiment of the present invention.

Figure 3A:
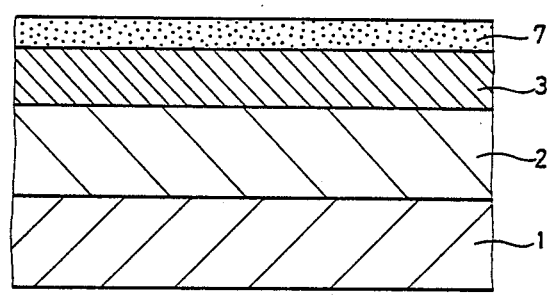
FIGS. 3A to 3D are cross sectional views showing major processes producing a redundant circuit of a semiconductor device of an embodiment of the present invention.

Referring to FIG. 3A, a field oxide film 2 is formed on a silicon substrate 1, and subsequently, a polysilicon film 3 is formed on the field oxide film 2. The polysilicon film 3 is used for forming a first layer of a fuse for laser trimming. Then, a film 7 of metal silicide such as molybdenum silicide, tungstem silicide, titanium silicide, or tantalum silicide is formed on the polysilicon film 3. The metal silicide film 7 is used for forming a second layer of the fuse for laser trimming.

Figure 3B:
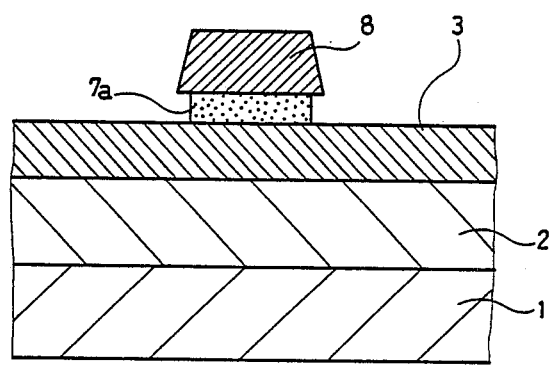

Referring now to FIG. 3B, photoresist (not shown) is formed on the metal silicide film 7, and is patterned into a desired shape to form a photoresist mask 8. Subsequently, only the metal silicide film 7 is selectively etched away utilizing the photoresist mask 8 as a mask so as to form a metal silicide film 7a having a width $l_1$ of 1 to 2 $\mu$m and a thickness of 1000 to 3000 Å.

Figure 3C:
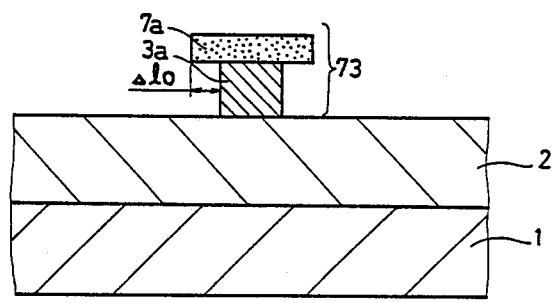

Referring now to FIG. 3C, the polysilicon film 3 is selectively etched using an etching gas having faster etching speed for the polysilicon film 3 than for the metal silicide film 7a, and utilizing the photoresist mask 8 as a mask so as to form a polysilicon film 3a. The polysilicon film 3a has a narrower line width than that of the metal silicide film 7a by $\Delta l_0$ on one side, e.g. a width $l_0$ of 0.1 to 0.3 $\mu$m and a thickness of 500 to 3000 Å. That is, a fuse 73 for laser trimming in T shape in cross section is formed of the polysilicon film 3a and the metal silicide film 7a. Then, the photoresist mask 8 is removed.

Figure 3D:
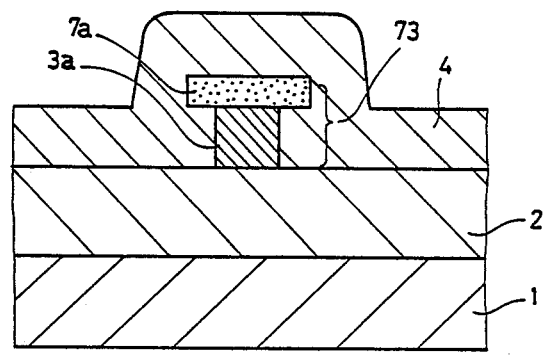
Figure 4:
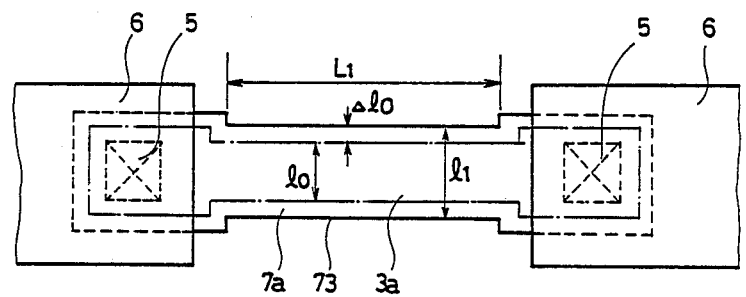
FIG. 4 is a plan view showing a redundant circuit of a semiconductor device produced by the processes shown in FIGS. 3A to 3D.

Referring now to FIG. 3D, a PSG film 4 is deposited to cover the fuse 73 by the CVD method. A contact hole 5 is then formed in a predetermined position of the PSG film 4, and an aluminum interconnection 6 is formed on the PSG film 4 and in the contact hole 5, so that the redundant circuit of a semiconductor device including the fuse 73 for laser trimming is completed. FIG. 4 is a plan view of the redundant circuit of a semiconductor device completed in accordance with the above described processes.

Figure 5:
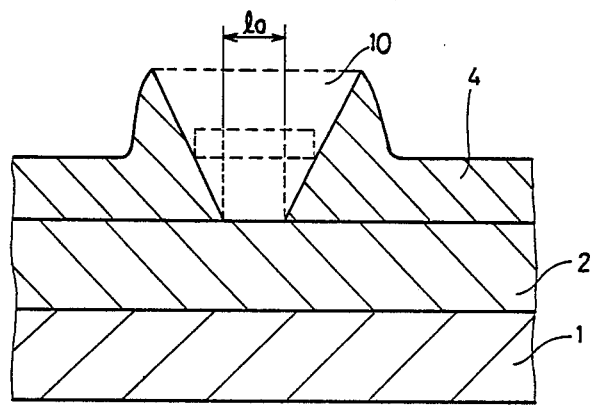
FIG. 5 is a cross sectional view in which a fuse 73 of the redundant circuit shown in FIGS. 3A to 4 is disconnected.

FIG. 5 is a cross sectional view in which the fuse 73 of the redundant circuit shown in FIGS. 3D and 4 is disconnected by the laser beam. Referring now to FIG. 5, operation of disconnecting the fuse 73 is described.

Figure 1A:
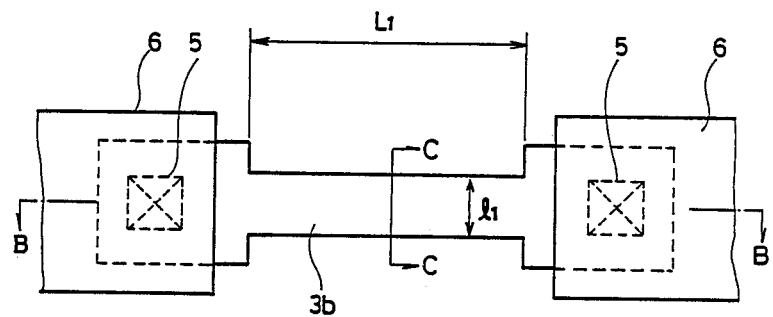
FIG. 1A is a plan view showing an example of a conventional redundant circuit of a semiconductor device.
Figure 1B:
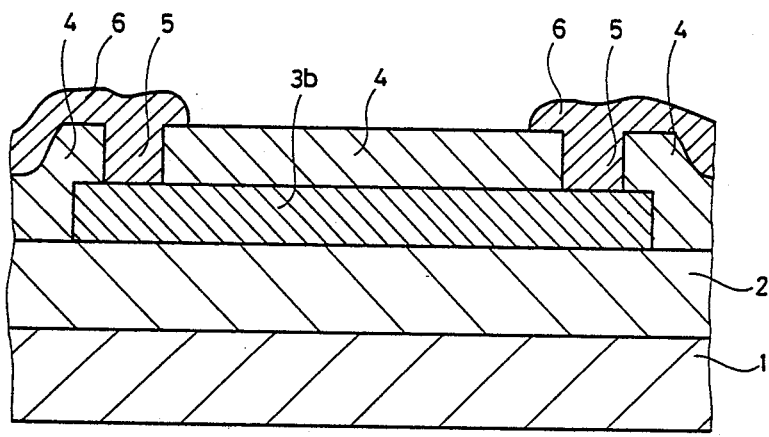
FIG. 1B is a cross sectional view taken along a line B—B in FIG. 1A.
Figure 1C:
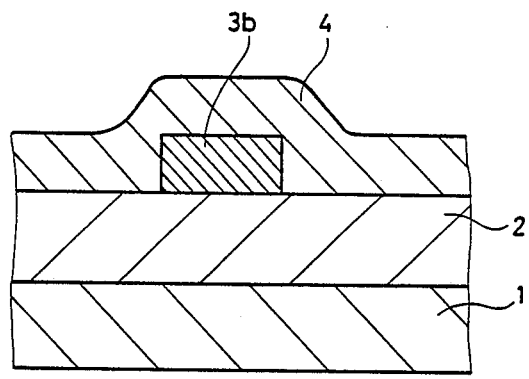
FIG. 1C is a cross sectional view taken along a line C—C in FIG. 1A.

When a circuit of a semiconductor device is replaced, the laser beam is irradiated on the PSG film 4 in FIG. 3D, and laser beam energy is absorbed in the fuse 73, in which case the energy distribution is generally the Gaussian distribution, so that the temperature difference under heat occurs between the central portion and the end of the fuse 73. However, since the line width $l_0$ of the polysilicon film 3a constituting the first layer of the fuse 73 is narrower, by 2 $\Delta l_0$, than the line width $l_1$ of the conventional fuse 3b shown in FIG. 1A, the temperature difference under heat between the central portion and the end of the fuse 73 is smaller as compared with the conventional fuse 3b. Accordingly, the polysilicon film 3a constituting the first layer of the fuse 73 is uniformly and reliably fused and expanded, and the fuse 73 is uniformly and reliably disconnected.

Figure 2:
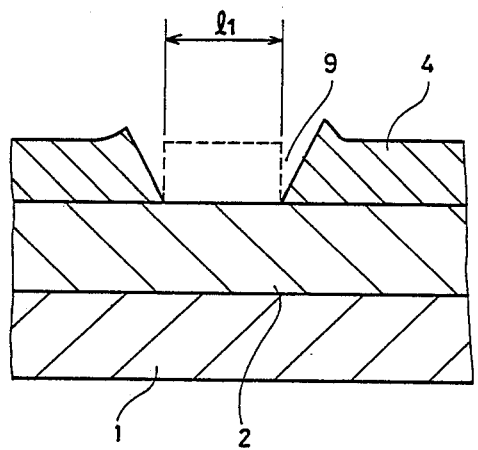
FIG. 2 is a cross sectional view in which a fuse 3b of the redundant circuit shown in FIGS. 1A to 1C disconnected.

In addition, as shown in FIG. 5, an opening 10 is formed in the PSG film 4 after explosion and splash thereof. The width 10 of the bottom of the opening 10 is narrower by 2$\Delta l_0$ than the width $l_1$ thereof in the conventional redundant circuit, so that the opening 10 is smaller than the conventional opening 9 in FIG. 2. Therefore, the effect on an adjacent circuit in disconnecting the fuse by the laser beam is reduced, thereby allowing high integration of a semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A redundant circuit of a semiconductor device comprising;
   a first metal interconnection layer,
   a second metal interconnection layer spaced apart from said first metal interconnection layer,
   a fuse for electrically connecting said first and second metal interconnection layers, said fuse having a two-layer structure comprising a first linear film of a first material and a second linear film layer of a second material formed on said first film, and a line width of said first film being narrower than that of said second film, and
   a glass film formed to cover said fuse.

2. A redundant circuit of a semiconductor device in accordance with claim 1, wherein said first material is polysilicon and said second material is metal silicide.

3. A redundant circuit of a semiconductor device in accordance with claim 2, wherein said second material is selected from a group including molybdenum silicide, tungsten silicide, titanium silicide, and tantalum silicide.

4. A redundant circuit of a semiconductor device in accordance with claim 1, wherein said glass film is a PSG film.

5. A redundant circuit of a semiconductor device in accordance with claim 1, wherein said spaced apart first and second metal interconnection layers are connected to said fuse through a contact hole formed on siad glass film.

* * * * *